US 6,614,093 B2

(12) United States Patent
Ott et al.

(10) Patent No.: US 6,614,093 B2
(45) Date of Patent: Sep. 2, 2003

(54) INTEGRATED INDUCTOR IN SEMICONDUCTOR MANUFACTURING

(75) Inventors: George Ott, Colorado Springs, CO (US); Richard Cole, Woodland Park, CO (US); Matthew Von Thun, Colorado Springs, CO (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/013,572

(22) Filed: Dec. 11, 2001

(65) Prior Publication Data

US 2003/0109118 A1 Jun. 12, 2003

(51) Int. Cl.[7] .............................................. H01L 29/00
(52) U.S. Cl. ...................... 257/531; 257/10; 336/200; 336/225
(58) Field of Search ........................... 257/531, 10, 11; 336/200, 225; 361/765, 777, 782

(56) References Cited

U.S. PATENT DOCUMENTS

| | | | | | |
|---|---|---|---|---|---|
| 4,313,152 A | * | 1/1982 | Vranken | ...................... | 361/765 |
| 5,336,921 A | * | 8/1994 | Sundaram et al. | .......... | 257/531 |
| 5,610,433 A | * | 3/1997 | Merrill et al. | ............... | 257/531 |
| 5,612,660 A | * | 3/1997 | Takimoto | ..................... | 336/200 |
| 5,831,331 A | * | 11/1998 | Lee | .............................. | 257/659 |
| 5,884,990 A | * | 3/1999 | Burghartz et al. | .......... | 336/200 |
| 6,008,102 A | * | 12/1999 | Alford et al. | ................ | 438/381 |
| 6,037,649 A | * | 3/2000 | Liou | ........................... | 257/531 |
| 6,240,622 B1 | * | 6/2001 | Ahn et al. | ..................... | 29/604 |
| 6,291,872 B1 | * | 9/2001 | Wang et al. | ................. | 257/531 |
| 6,376,895 B2 | * | 4/2002 | Farrar et al. | ................. | 257/531 |

FOREIGN PATENT DOCUMENTS

| | | | | | |
|---|---|---|---|---|---|
| DE | 3346659 A1 | * | 7/1985 | ............. | H01L/1/09 |
| JP | 3-61-179562 | * | 8/1986 | ................. | 257/531 |
| JP | 4-2-69971 | * | 3/1990 | ................. | 257/531 |
| JP | 4-3-178158 | * | 8/1991 | ................. | 257/531 |
| JP | 4-4-348558 | * | 12/1992 | ................. | 257/531 |
| JP | 4-6-21347 | * | 1/1994 | ................. | 257/531 |

* cited by examiner

*Primary Examiner*—George Eckert
(74) *Attorney, Agent, or Firm*—Suiter West PC LLO

(57) ABSTRACT

An integrated inductor is formed on an integrated circuit or other substrate. The inductor is formed of a stack of almost totally enclosed rings of conductive material in which each ring has a single gap. Vias connect adjacent rings on opposite sides of their gaps so as to form a coil shaped structure. The inductor has applications in filtering, in an oscillator, in an antenna, combined with an active detection circuit, combined with an electron source, in a microelectromechanial systems or MEMS, or the like. The inductor may be formed in a vertical orientation or in a horizontal orientation. Chemical mechanical polishing may be used for planarizing layers.

43 Claims, 9 Drawing Sheets

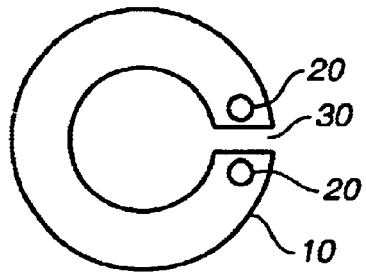
FIG._1
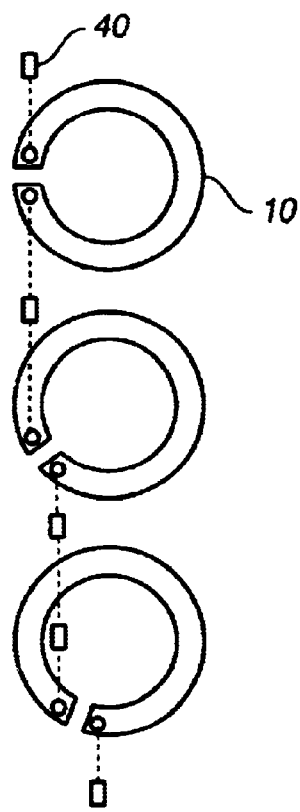
FIG._2
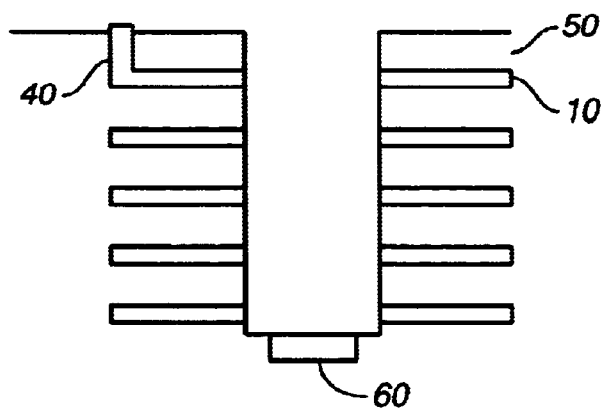
FIG._3

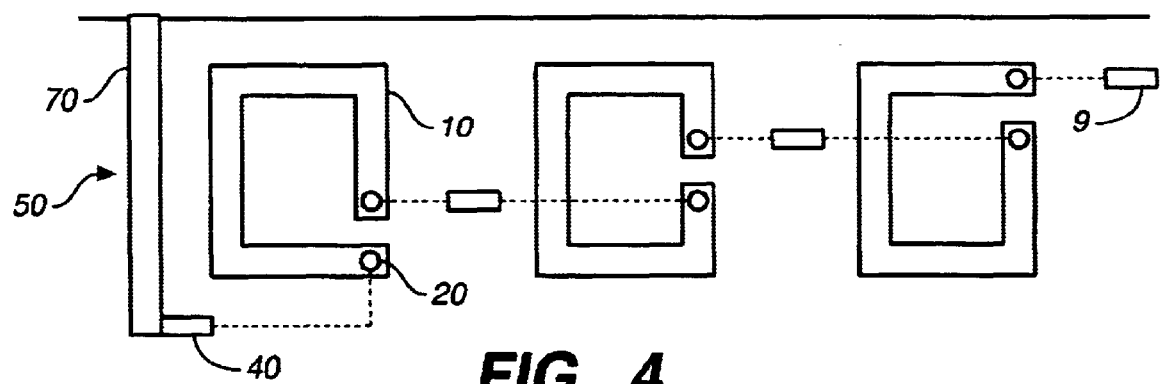
FIG._4
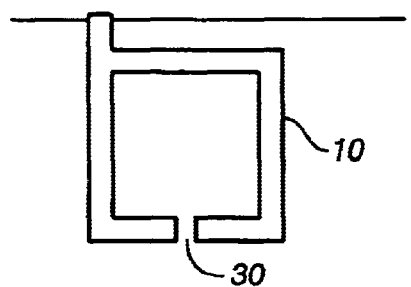
FIG._5
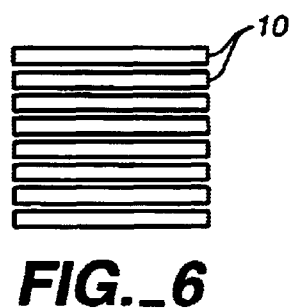
FIG._6

FIG._7B
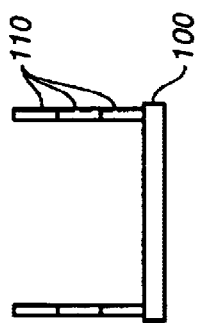
FIG._7D
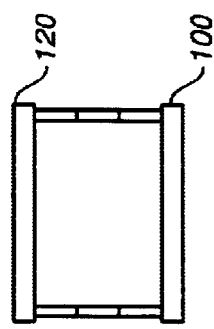
FIG._7F
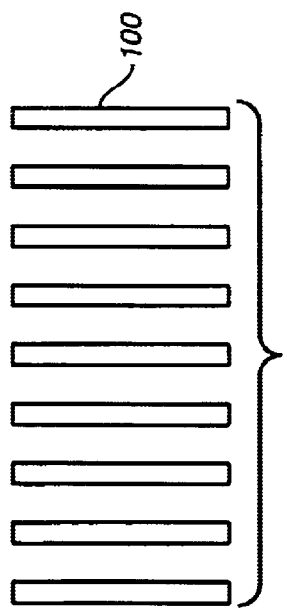
FIG._7A TOP VIEW
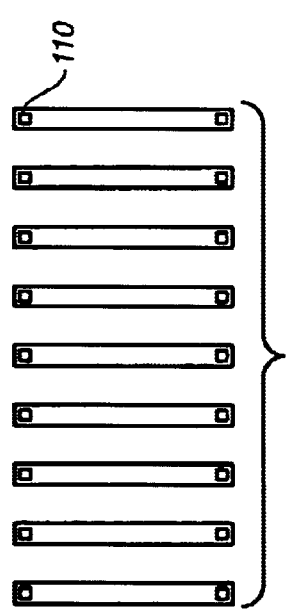
FIG._7C TOP VIEW
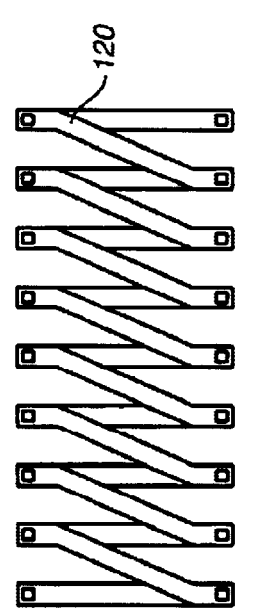
FIG._7E TOP VIEW

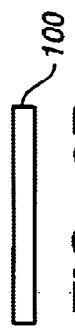
FIG._8B
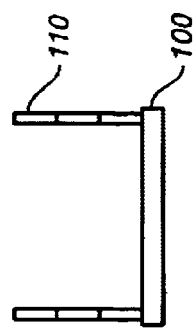
FIG._8D
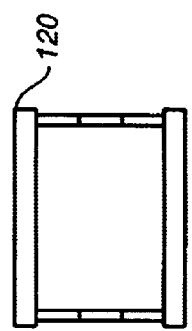
FIG._8F
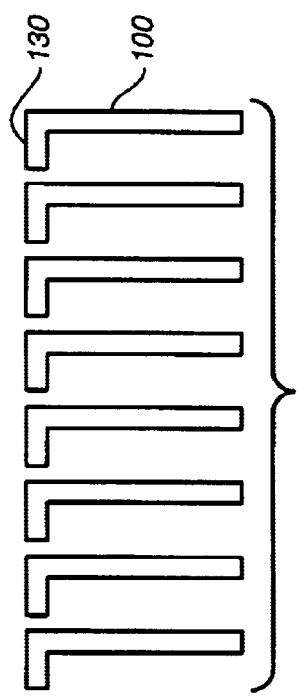
FIG._8A TOP VIEW
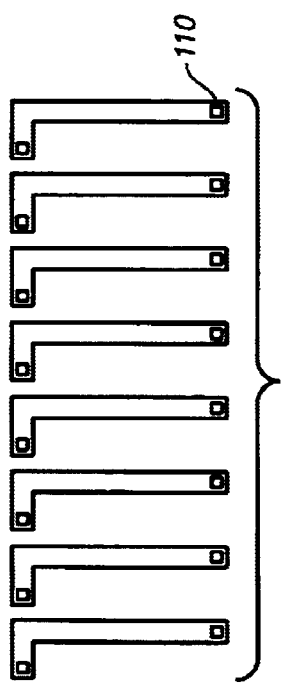
FIG._8C TOP VIEW
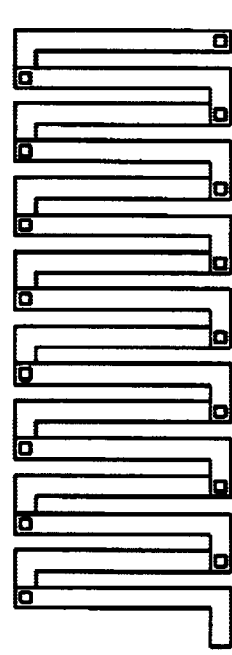
FIG._8E TOP VIEW

FIG._9B
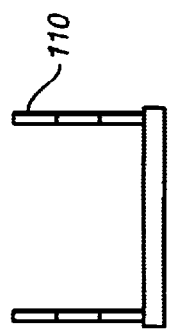
FIG._9D
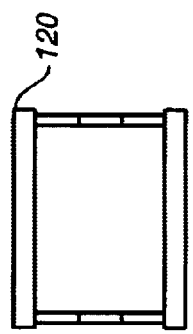
FIG._9F
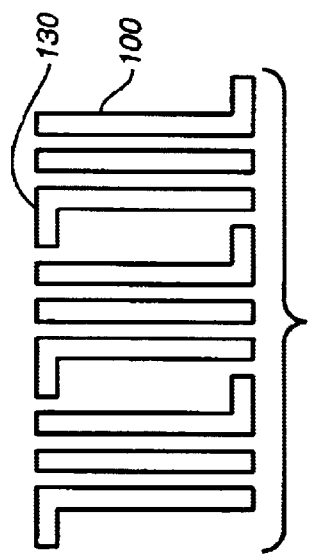
FIG._9A TOP VIEW
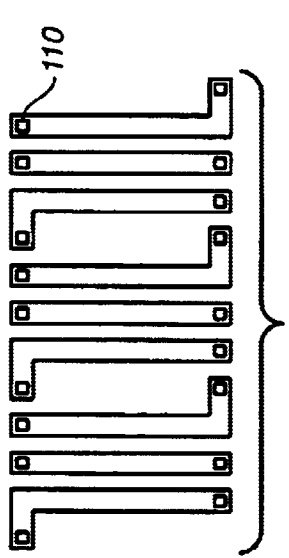
FIG._9C TOP VIEW
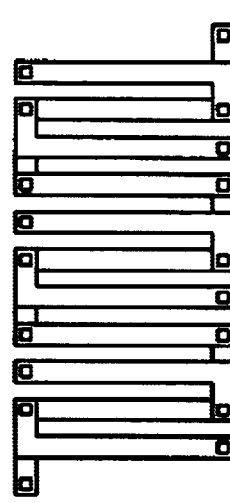
FIG._9E TOP VIEW

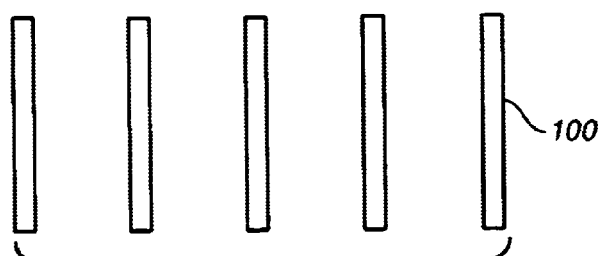
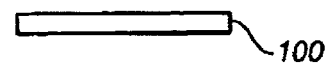
FIG._10A TOP VIEW  FIG._10B
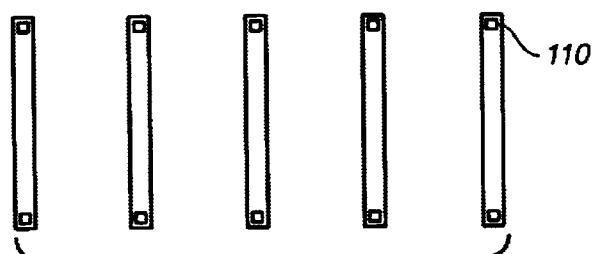
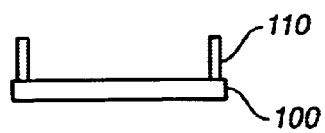
FIG._10C TOP VIEW  FIG._10D
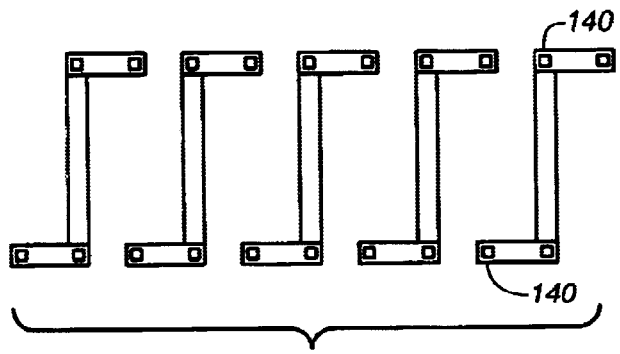
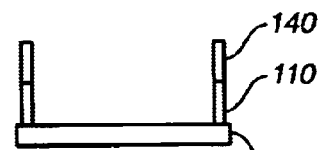
FIG._10E TOP VIEW  FIG._10F
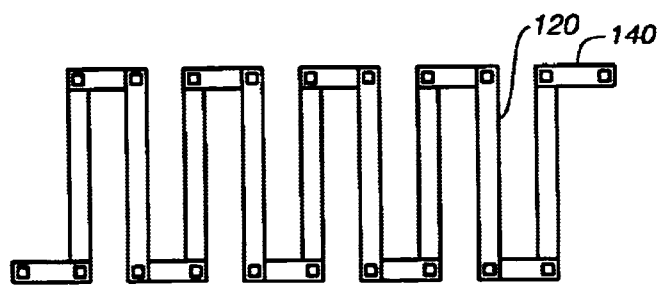
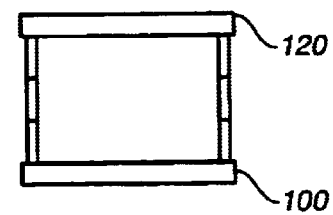
FIG._10G TOP VIEW  FIG._10H

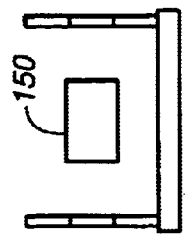
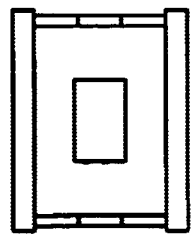
FIG._11B
FIG._11D
FIG._11F
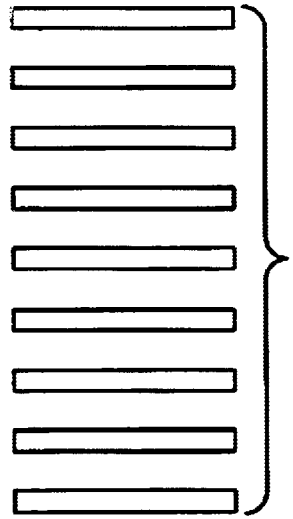
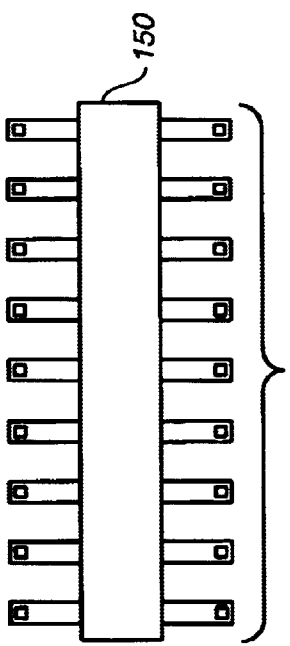
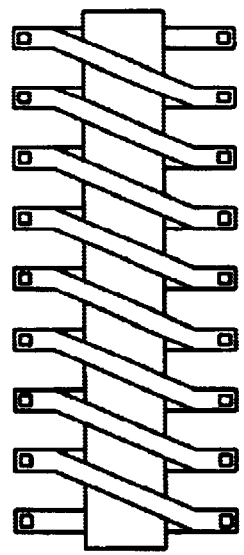
FIG._11A TOP VIEW
FIG._11C TOP VIEW
FIG._11E TOP VIEW

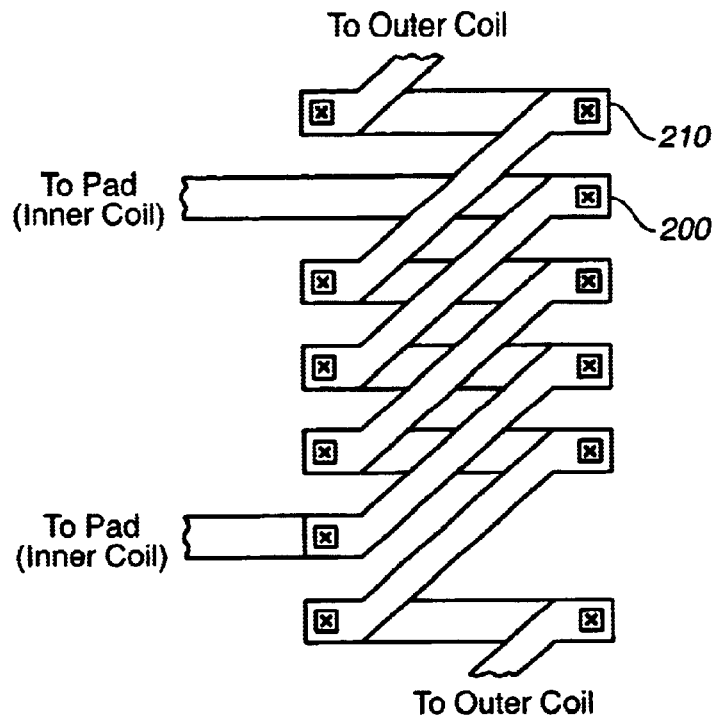
FIG._12
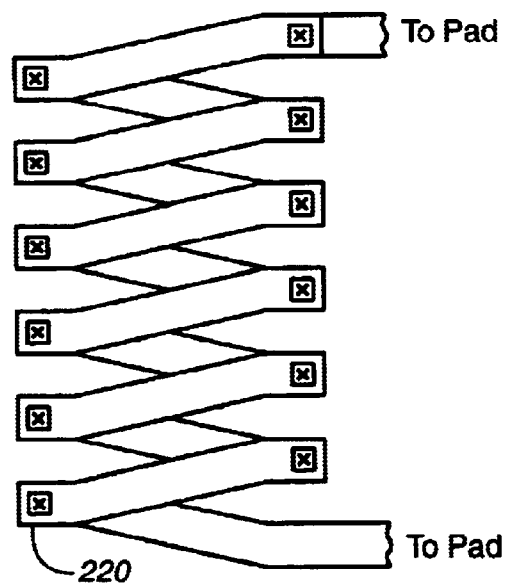
FIG._13

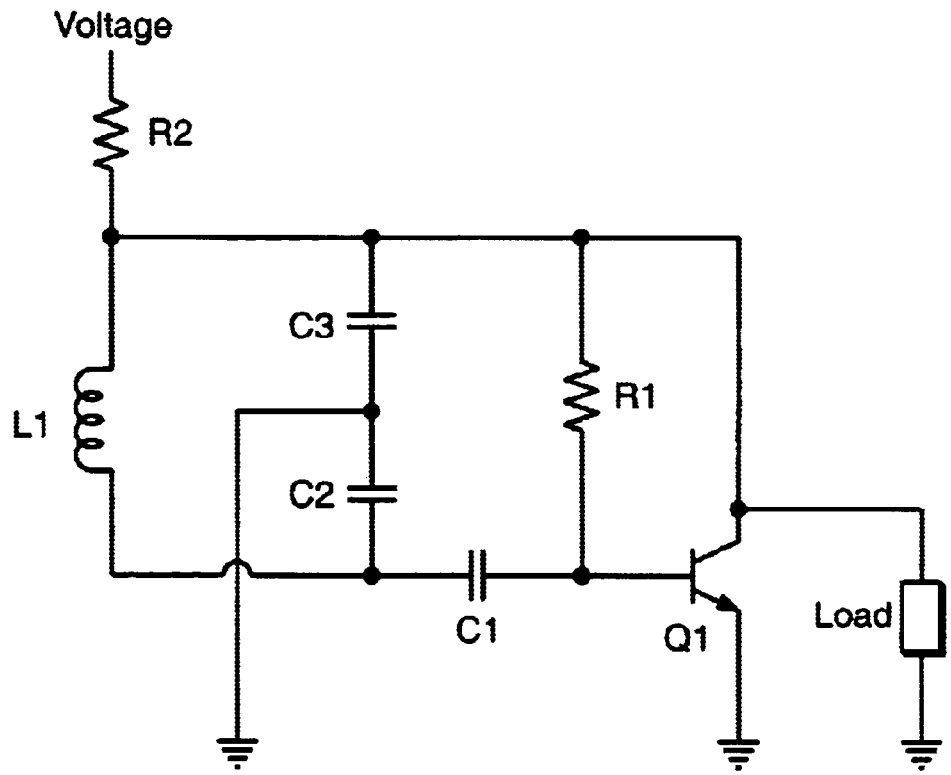
FIG._14
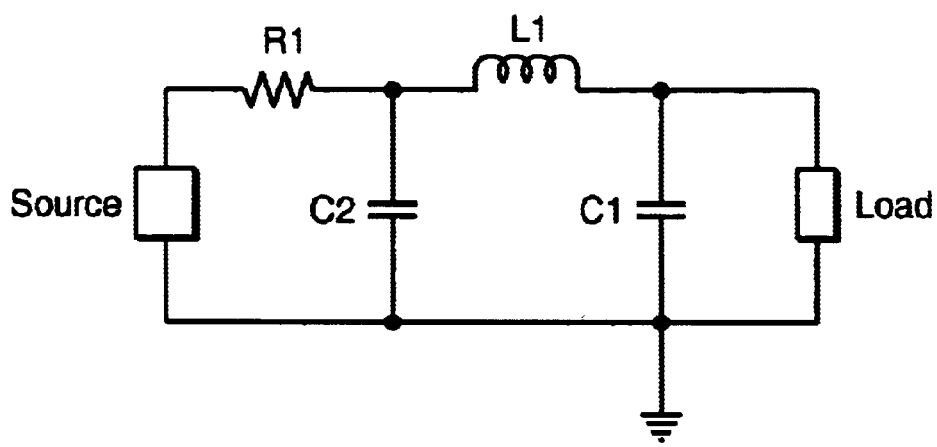
FIG._15

INTEGRATED INDUCTOR IN SEMICONDUCTOR MANUFACTURING

FIELD OF THE INVENTION

The present invention generally relates to the field of semiconductor manufacture, and particularly to fabricating an inductor in a semiconductor device.

BACKGROUND OF THE INVENTION

Semiconductor manufacture has long been able to create component parts on a micron scale. In semiconductor manufacture, various layers of conductive material, dielectric material, and semiconducting material are deposited and etched to form structures on silicon, ceramic, plastic, or other substrates. The processing includes laying down resist materials and etching those materials through masks. Thin film FET transistors, consisting of drain, gate, and source terminals, may be constructed through the deposition and etch processes. Capacitors may also be constructed by the processing. Diodes may also be formed on the substrate.

There are several processes for forming integrated circuit layers on a substrate.

The CVD process involves masking the surface of a semiconducting substrate with an oxide or nitride and removing the oxide or nitride in the areas where epitaxial growth is desired. In CVD, all reactants required for film growth are simultaneously exposed to a wafer surface, where they continuously deposit a thin film. CVD deposition rates can be surface-limited at lower temperatures, or mass-flow-limited at higher temperatures where deposition rates are relatively higher. Layers are deposited. A photoresist pattern is then deposited. A mask is placed above the substrate. Portions of the photoresist are developed corresponding to the mask pattern. Etching of the photoresist and underlying layer occurs. The photoresist is removed to yield a desired pattern. A planar structure is achieved by etching holes to interconnect various layers. Epitaxial growth by CVD requires a surface catalyzed reaction. Deposition occurs only on the semiconducting substrate and not on the oxide or nitride film.

Molecular beam epitaxy (MBE) forms thin films of metal, dielectric, and semiconductor compounds of controllable thickness and conductivity type on a semiconductor substrate. The substrate is first heated to reduce contamination on the surface where the films are to be deposited. A vacuum chamber houses gun port containing several guns thermally insulated from one another. A substrate holder of a refractory material rotates. The substrate holder is provided with an internal heater. A thermocouple is disposed in an aperture on the side of substrate. The chamber includes a pump for evacuating the chamber to a pressure of around a millionth of a Torr. Source material is placed in the source chamber for vaporization by a heating coil which surrounds the crucible. Selected guns are heated so as to vaporize the contents of the crucible to produce a molecular beam. Vaporization may occur by evaporation or sublimation depending on whether the gun temperature is above or below the melting point of the crucible material. Growth of the epitaxial film is done by directing the molecular beam generated by the guns at the substrate surface. Growth is continued for a time period sufficient to yield an epitaxial film of the desired thickness. This technique permits the controlled growth of films of thickness ranging from a single monolayer of several Å to more than 100,000 Å.

Atomic layer deposition (ALD) is a thin-film deposition technique used to fabricate ultrathin and conformal thin film structures below 0.2 $\mu$m. ALD is especially useful for the deposition of ultrathin and conformal films of high dielectric oxides, storage capacitor dielectrics, capacitor electrodes and diffusion barriers. ALD forms layers of oxides, nitrides, metals, and semiconductors to using sequential self-limiting surface reactions to provide atomic layer control and allow conformal films to be deposited on very high aspect ratio structures. In ALD, reactants are introduced in a gaseous state in pulses which are separated from each other by purge gas. Each reactant pulse chemically reacts with the surface of the substrate. When ALD deposits materials to be combined in a single layer, the first reactant may contain the first material and the second reactant the second material. For example, the first pulse may deposit a metal-containing layer, and the second pulse may react with that layer to form the complete film of metal oxide or metal nitride. Film thickness can be controlled to within a monolayer solely by counting pulses. Because ALD has a low deposition rate, it is most suitable for ultrathin films whose thicknesses range from a few to 100 Å. This process makes high quality conformal and uniform films.

Analog circuitry ideally involves the use of both capacitors and inductors as passive components. Capacitors are relatively easy to integrate into integrated circuit manufacturing. Traditionally, inductors have been difficult to manufacture.

Semiconductor manufacturing methods based on the stacked deposition and patterning of successive layers or the lamination of such layers to form high-density wiring structures of sufficient tolerance for inductors have been deficient in that a new layer is fabricated, the previously deposited and patterned layers are exposed to contamination and damage from successive thermal, chemical/solvents, mechanical and other stress-related operations. Defective devices often result. Production is often costly.

Therefore, it would be desirable to provide inductor elements in an integrated circuit.

SUMMARY OF THE INVENTION

Accordingly, the present invention is directed to an inductor which is formed on a substrate, especially an integrated circuit substrate.

The present invention can be configured in two different forms. In the first form, inductor coils are constructed parallel to the plane of the substrate, while the core of the inductor extends vertically out of the substrate. This form is the vertically oriented inductor. In the second form, the inductor coils are constructed such that the plane of the coil is perpendicular with the plane of the substrate, while the core of the inductor extends parallel to the plane of the substrate. This form is the horizontally oriented inductor.

In a first aspect of the invention, in the vertical orientation of the inductor, the inductor is formed on a substrate, has a plurality of rings of metallization, wherein each of the rings has a single gap along its perimeter. These rings may be circular or take the form of any polygonal shape. The gap in each successive ring is offset in such a way as to allow a continuous spiral connection.

In a second aspect of the present invention, a method for making a vertically oriented inductor on a substrate, comprises the steps of depositing a first layer of metal on a surface, the first layer of metal having a pattern, depositing a first layer of dielectric material over the first layer of metal having a pattern, forming a first through hole in the first layer of dielectric material, filling the first through hole with a conductive material, and depositing a second layer of metal on the first layer of dielectric material, the second layer of metal having a pattern similar to the pattern of the first layer of metal, with the gap in the pattern offset from the previous layer as described previously.

In a third aspect of the present invention, an electronic circuit on a substrate which includes an inductor formed as part of the substrate, wherein the inductor is formed of a plurality of almost entirely enclosed toroids of conductive material with a non-conductive interior, each toroid having a major plane of extension, wherein each toroid is conductively interconnected with an adjacent toroid by a conductor which extends generally in a plane perpendicular to the major plane of extension of the toroid.

In a fourth aspect of the present invention, a method for forming an inductor whose longitudinal axis is parallel to the major plane of extension of a substrate upon or in which it is formed, including the steps of depositing a first conductive layer and forming first parallel strips of conductive material of a first length, one or more layers of non-conducting dielectric material is deposited on the parallel strips. Via holes are etched through the dielectric holes and are filled with a conductive plug material. Finally, a conductive layer is deposited and patterned in such a manner that the final structure forms a coil shape.

In a fifth aspect of the present invention, one or more horizontally oriented coils can be interdigitated.

In a sixth aspect of the present invention, the cores of either the horizontal or vertical inductors may be filled with a conductive or non-conductive material. This material may be used to alter the value of the inductance.

The present invention permits straightforward integration in the integrated process flow.

The present invention permits the choice of inductor core materials based on any process compatible film.

The present invention permits building an active detector at the bottom of the coil to make a tuneable charged particle detector.

The present invention allows an oscillator, filter, or other electronic circuit containing an inductor to have that inductor built in a deposition process.

The present invention offers a high $L/\mu m^2$ density.

The present invention provides for the formation of two or more mutually coupled inductors which may be used to create transformers, inductively based sensing circuits or other circuits involving coupled inductors.

The present invention may be configured such that the physical properties of the core material are altered by the presences of current in the inductor. This allows for such applications as phase shift based optical wave guides.

The present invention allows for the creation of an electro magnet which may be used in microelectromechanical systems or MEMS applications. MEMS refers to a type of systems that is physically small and has both electrical and mechanical components. Integrated circuit fabrication techniques and materials are one way to create these very small mechanical devices.

It is to be understood that both the forgoing general description and the following detailed description are exemplary and explanatory only and are not restrictive of the invention as claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous advantages of the present invention may be better understood by those skilled in the art by reference to the accompanying figures in which:

FIG. 1 illustrates a ring or toroid used to form the coil structure of the inductor of the present invention;

FIG. 2 illustrates an exploded view of the coil structure of the inductor of the present invention;

FIG. 3 illustrates a first embodiment of the present invention implemented as an electron source or as a particle detector;

FIG. 4 illustrates a second embodiment of the present invention;

FIG. 5 illustrates a cross sectional view of the second embodiment;

FIG. 6 illustrates a longitudinal view of the present invention;

FIGS. 7A to 7F illustrate a horizontal inductor configuration, optimized for high coil density;

FIGS. 8A to 8F illustrate a horizontal inductor configuration using only 90 degree angles;

FIGS. 9A to 9F (illustrate a horizontal inductor configuration using only 90 degree angles, with higher coil density than the inductor of FIGS. 8A to 8F;

FIGS. 10A to 10H illustrate a horizontal inductor configuration using intermediate metal as part of a coil;

FIGS. 11A to 11F illustrate a horizontal inductor configuration showing optional core filling techniques;

FIG. 12 illustrates a pair of interdigitated or intertwined inductor coils;

FIG. 13 illustrates an inductor coil in which two levels of metallization are formed in a slanting manner;

FIG. 14 illustrates the inductor of the present invention used in an oscillator circuit; and FIG. 15 illustrates the inductor of the present invention used in a filter circuit.

DETAILED DESCRIPTION OF THE INVENTION

Reference will now be made in detail to the presently preferred embodiments of the invention, examples of which are illustrated in the accompanying drawings.

Referring generally now to FIGS. 1 through 15, exemplary embodiments of the present invention are shown.

FIG. 1 shows a component ring 10 of the inductor coil. The ring 10 is almost totally enclosed except for a gap 30. The gap should offer enough distance between the two ends of the ring to avoid any problem with hillocks or other shorts forming during the manufacturing method. At either end of the ring 10 is an area 20 for contacting the via. This is not a specially processed portion of the ring, but merely shows that the ring will be electrically connected proximate or at that point. The material of the ring or toroid 10 is any conductive material that is compatible with the processing and other layers in which it may have some effect because of contact or proximity. For example, the ring or toroid may be made of gold, titanium, molybdenum, copper, silver, aluminum, hafnium, tin, or any alloy of these metals, may be made of a conductive oxide or nitride such as indium tin oxide, or may be formed of some other conductive material. The intervening insulating layers between rings may be formed of any compatible insulating material such as nitrides or oxides. Specific examples of such insulating materials include silicon dioxide, silicon nitride, and organic tetraethyl —oxysilane (TEOS).

FIG. 2 shows an exploded view of an inductor. Multiple rings 10 are stacked one above another and are separated by intervening insulating or dielectric layers. Vias 40 connect the individual rings 10 to create a good approximation to a coil structure. As shown in FIG. 2, each successive ring's gap is rotated with respect to the previous ring's gap and in the same direction as one travels through the resulting coil structure. The rings are connected to adjacent rings such that the vias 40 connect one side of the ring with respect to its gap to the opposite side of the adjacent ring with respect to that adjacent ring's gap. This structure allows current to pass along the coil structure as in a common coil inductor.

FIG. 3 shows a cut away view of a vertically oriented inductor used with a combined with an component 60. In one embodiment, the component 60 is an electron source at the bottom of the coil which could provide a narrow and highly controlled beam of electrons potentially useful for electron microscopy and elemental analysis tools. Alternatively, component 60 is an active detection circuit which is useable as a tuneable charged particle detector with possible uses in implanter controls and high-energy physics. The detector may be implemented as a silicon PN junction.

Air may be the insulating material within the coil structure. A high permeability material may be placed inside the coil structure. An insulating fill material may be placed inside the coil structure.

Not shown are the vias which would necessarily interconnect adjacent rings. A conductor 40 reaches through the dielectric layers 50 to act as a contact terminal. The coil structure formed from the interconnected rings 10 generate a magnetic flux through the center of the coil structure. A charged particle will be driven along by the magnetic flux lines outside the coils structure and through the coil structure to be sensed by the particle detector 60.

The general formula for inductance of a coil where the cross section of the coil is circular is given by the equation $$L=\mu N^2 A/s,$$

where L is the inductance, $\mu$ is the permeability, N is the number of turns, A is the area of the cross section of the coil, and s is the length of the coil.

FIG. 4 shows an exploded view of a second embodiment of the inductor in which the inductor is oriented such that its longitudinal axis is in or parallel to the major plane of extension of the substrate. As in the first embodiment, the rings 10 have gaps which are offset in a rotational manner with the gaps of successive rings. Also, the vias 40 are really short patterned conductors on insulating or dielectric layers 50, rather than formed through them, to connect adjoining rings 10.

In the second embodiment, there are certain constraints which limit the cross sectional shapes possible in the coil structure. These constraints include the requirement of depositing a multitude of alternating layers of conductive material and dielectric material to make an approximation of a curve in the coil structure. During processing, very thin layers with very tight tolerances need to be successively laid down to make a curved shape approximation. To do so would entail prohibitively high cost. Basically, in the horizontal orientation of the second embodiment, the shape of the coil cross-section is limited to a square or rectangle.

The general formula for inductance of a coil where the cross section of the coil is a square is given by the equation $$L=\mu N^2 A/(2\pi \ln(r2-r1)),$$

where L is the inductance, $\mu$ is the permeability, N is the number of turns, A is the area of the cross section of the coil, r2 is the outer radius, and r1 is the inner radius.

FIG. 5 shows a cross sectional view of the inductor of the second embodiment. As with all rings 10, there must be a gap 30 which is as small as possible and large enough to avoid the development of any shorts, such. as from hillocks or via like connecting conductors, across the gap 30.

FIG. 6 shows an exposed view of the ring structure of the inductor of the present invention. The interconnecting vias are not shown.

Thus, there are two possible integrated inductor configurations: vertical and horizontal. The vertical configuration occupies a smaller area than a horizontal configuration and is more likely to be used for charged particle detection or emission. The horizontal configuration allows for a significantly longer coil structure than the vertical configuration since its length is not limited by the number of layers deposited.

The thickness of individual conductive and insulating layers depends upon the application. Current processes allow layer thicknesses as low as several Angstroms. The inductor of the present invention is meant to be scalable.

FIGS. 7A to 7F illustrate a horizontal inductor configuration, optimized for high coil density. In FIGS. 7A and 7B, an initial set of parallel lengths 100 of conductive material is laid down upon an insulating layer. In FIGS. 7C and 7D, successive layers of dielectric layers are laid down and successive plugs of conductive material 110 are formed in its corresponding dielectric layer to form a ring or toroid structure. By using successive layers of dielectric material, the cross sectional area of the inductor coil may be made greater than it would be relying on single dielectric layer. The use of a single dielectric layer, although within the scope of the present invention, limits the vertical height because there are limits to the depth in which a given through hole or via may be formed through its corresponding dielectric layer. A last set of conductive lengths 120, formed at a slant, connect the various ring like structures to form a coil structure.

FIGS. 8A to 8F illustrate a horizontal inductor configuration using only 90 degree angles. In this embodiment, the initial set of conductors 100 are formed with an appendage 130 to connect with an adjacent final conductor. The final set of conductors ad 120 are formed with a similar appendage to connect neighboring rings or toroids.

FIGS. 9A to 9F illustrate a horizontal inductor configuration using only 90 degree angles, with a higher coil density than the inductor of FIGS. 8A to 8F.

FIGS. 10A to 10H illustrate a horizontal inductor configuration using intermediate metal as part of a coil. Initially, a set of parallel conductors 100 are formed on an insulating layer or substrate. A plug or successive plugs 110 of conductive material are formed over their corresponding conductors 100. A connection appendage 140 is formed over the plug or successive plugs 110 to allow connection to form the coil structure. Another plug or successive plugs 110 of conductive material are formed over the appendage 140 and underlying plugs 110. A final set of parallel conductors 120 are formed to connect appendages 140 and complete the coil structure.

FIGS. 11A to 11F illustrate a horizontal inductor configuration showing optional core filling techniques. The inductance of the inductor may be increased by adding a core to the inductor. The formation of this device is similar to the device of FIGS. 7A to 7F. The core 150 may be formed by cutting a trench into the dielectric and capping it with a dielectric. The core 150 may be formed of copper, gold, ferromagnetic material, or other suitable material. A damascene process for encapsulating the core material may be used so as to prevent migration of the core material to other component parts and impairing device function.

FIG. 12 illustrates a pair of interdigitated or intertwined inductor coil 200 and 210 for inductively coupled networks. In this embodiment, it is important to scale the coils so that their inductance is not dominated by capacitive effects. Capacitive effects may arise through surrounding metallization.

FIG. 13 illustrates an inductor coil 220 in which two levels of metallization are formed in a slanting manner.

Applications of the inductive circuit element in a filtering, an oscillator, or an antenna. FIG. 14 shows an inductor of the present invention used in an oscillator circuit which generates a sine wave and has inductive-capacitive feedback. FIG. 15 shows an inductor used in a filter circuit. Other uses of the present invention are possible. The present invention may also be used in microelectromechanical devices. One possible application concerns the use of the inductor with a filled core of the present invention to control an array of mechanically deformed micromirrors. Instead of electrostatic control, magnetic forces could be used to control microdevices.

Recent improvements in planarization technology and conformal films have made it possible to integrate inductors more easily. With the increasing number of layers of metallization possible in IC manufacturing, it has become possible to build a vertically oriented coil/ inductor using a set of split metal rings, one built on each metal layer and joined together using standard via techniques. The manufacture is a standard pattern and etch of the metal layers to provide the horizontal rings combined with standard planarization, etch, and via techniques to join the rings.

Any process may be used, such as CVD, MBE, or ALD, as long as it provides a smooth conformal conductive film on an insulating layer having a via formed therein. The rings may be patterned by laser trimming. The component layers may also be formed in one location and then transferred to the desired substrate. The chosen process only needs to provide good planarity and step coverage as well as chemical compatibility and adhesion with contacting component layers. The process includes forming through holes in an insulating layer to a semiconducting or insulating substrate and depositing the various layers of semiconductor, insulating, and conductive material using the deposition techniques to provide a conformal film that exhibits good step coverage.

Chemical mechanical polishing (CMP) may be employed to improve the planarization of the layers. In this process, a slurry with silicon or other granular component is deposited on the layer to be polished. The granular components are about 0.2 microns in diameter. A pad is used to press upon and move around the slurry. The pad may rotate, the substrate may rotate, or both the pad and the substrate may rotate.

In manufacture, for a vertically oriented inductor, a substrate is chosen. Several underlying layers may first be deposited and patterned to form conductor paths and various component layers. Then, an insulating film may be deposited and may also be patterned to include a via for each inductor to be formed. The via is thereafter filled with a conductive material. A first metal or other conductive layer is then deposited over the via. A mask may be used to form a metal or conductor pattern or the pattern may be developed through etching, laser trimming, or other cut and remove process to form a ring or toroid shape which has a gap formed near the via in which the via electrically connects the ring or toroid. Any conductive material in the ring or toroid may be removed. To increase magnetic flux, conductive material may be retained within the ring or toroid and electrically insulated from it. Then, a dielectric or insulating layer is deposited over the ring or toroid. A through hole is formed in the insulating layer over the unconnected end of the ring or toroid immediately underneath. The through hole is filled with a conductive material. Another conductive layer is formed over the insulating layer. It is patterned in a similar manner to the first metal or conductive layer. The difference is that the gap of the second ring or toroid is rotated at an angle from the gap of the first ring or toroid. The end of the first ring or toroid is connected not to the corresponding end of the second ring or toroid, but to the opposing end of the ring or toroid. By building successive layers in this manner, a coil structure is created as long as the gap of the successive ring or toroid is rotated in the same direction as done in underlying layers.

In manufacture, for a horizontally oriented inductor, a substrate is chosen. Several underlying layers may first be deposited and patterned to form conductor paths and various component layers. In this case, a metal layer is deposited by a masking or later pattern so that there are parallel conductor lengths equal in number to the desired number of rings or toroids in the coil structure. The spacing between and thickness of the rings or toroids may also be set as desired. It may be that a gap location is to be formed in this first layer. The material is removed by etching, trimming, or other cutting and removing process to establish a gap which will effectively appear to rotate in a cross section view of the coil structure going from successive rings or toroids. Furthermore, if there are gaps to be formed in this layer of metallization or the next layer, conductors may be formed to electrically connect the rings or toroids which need to be connected at this level. The next layers deposited are a dielectric layer to serve at least as an inner area of the ring or toroid to be formed as well as relatively small strips of metal or conductive material. These strips are the length of the thickness of the toroid, measured by subtracting the inner radius from the outer radius. If a gap is to be formed, the affected ring or toroid has no metal or conductive material placed at the gap location and is filled there with the dielectric material. This may be accomplished by either not forming metal or conductive material at the gap or later removing such material. Again connecting strips of conductive material are also formed at this level through the dielectric to interconnect adjacent rings or toroids as needed. Successively layers of dielectric and conductive materials are built up. When the ring or toroid is to be finished, a length of conductive material is formed similar to that of the first length of the ring or toroid to form a nearly completely enclosed shape in a cross sectional view. Because of the constraints in processing, the horizontal inductor is basically limited to a squarish or rectangular cross section.

It is believed that the integrated inductor in semiconductor manufacturing of the present invention and many of its attendant advantages will be understood by the forgoing description. It is also believed that it will be apparent that various changes may be made in the form, construction and arrangement of the components thereof without departing from the scope and spirit of the invention or without sacrificing all of its material advantages, the form herein before described being merely an explanatory embodiment thereof. It is the intention of the following claims to encompass and include such changes.

what is claimed is:

1. A device for providing a narrow and highly controlled beam of electrons, comprising:

a substrate;

an inductor formed on the substrate, the inductor having a plurality of rings of conductive material, each of the plurality of rings separated from others of the plurality of rings by one or more solid dielectric layers, each of the plurality of rings having a perimeter and a single gap along the perimeter, adjacent ones of the plurality of rings being interconnected by one or more interconnection elements so as to approximately form a coil shape, the inductor having a first end and a second end, the inductor having a cavity throughout a length of the inductor, the cavity containing air only; and an electron source at the first end of the inductor, the electron source emitting electrons that form a beam controlled by the inductor.

2. The device for providing a narrow and highly controlled beam of electrons of claim 1, the interconnection elements extending generally perpendicularly with respect to a major planar extension of one of the plurality of rings.

3. The device for providing a narrow and highly controlled beam of electrons of claim 1, the interconnection elements extending at a slant with respect to a major planar extension of one of the plurality of rings.

4. The device for providing a narrow and highly controlled beam of electrons of claim 1, wherein at least one of the one or more solid dielectric layers is a nitride material.

5. The device for providing a narrow and highly controlled beam of electrons of claim 1, wherein at least one of the one or more solid dielectric layers is an organic tetraethyl-oxysilane.

6. The device for providing a narrow and highly controlled beam of electrons of claim 1, wherein a longitudinal axis of the inductor is oriented vertically with respect to a major plane of extension of the substrate.

7. The device for providing a narrow and highly controlled beam of electrons of claim 1, wherein a longitudinal axis of the inductor is oriented horizontally with respect to a major plane of extension of the substrate.

8. The device for providing a narrow and highly controlled beam of electrons of claim 1, wherein the rings of conductive material are formed from at least one of the group consisting of nickel, molybdenum, indium tin oxide, tantalum, tungsten, gold, copper, doped polysilicon, silicide, or silver.

9. The device for providing a narrow and highly controlled beam of electrons of claim 1, wherein each of the rings is formed of a bottom conductive segment, an intermediate conductive segment, and a top conductive segment.

10. The device for providing a narrow and highly controlled beam of electrons of claim 9, wherein the intermediate conductive element includes two plugs in contact with each other.

11. The device for providing a narrow and highly controlled beam of electrons of claim 1, wherein the rings are generally circular.

12. The device for providing a narrow and highly controlled beam of electrons of claim 1, wherein the rings are generally rectangular.

13. A tuneable charge detector, comprising:

a substrate;

an inductor formed on the substrate, the inductor having a plurality of rings of conductive material, each of the plurality of rings separated from others of the plurality of rings by one or more solid dielectric layers, each of the plurality of rings having a perimeter and a single gap along the perimeter, adjacent ones of the plurality of rings being interconnected by one or more interconnection elements so as to approximately form a coil shape, the inductor having a first end and a second end, the inductor having a cavity throughout a length of the inductor, the cavity containing air only; and a detector at the first end of the inductor, the detector detecting charged particles guided by the inductor.

14. The tuneable charge detector of claim 13, the detector being a silicon PN junction.

15. The tuneable charge detector of claim 13, the interconnection elements extending generally perpendicularly with respect to a major planar extension of one of the plurality of rings.

16. The tuneable charge detector of claim 13, the interconnection elements extending at a slant with respect to a major planar extension of one of the plurality of rings.

17. The tuneable charge detector of claim 13, wherein at least one of the one or more solid dielectric layers is a nitride material.

18. The tuneable charge detector of claim 13, wherein at least one of the one or more solid dielectric layers is an organic tetraethyl-oxysilane.

19. The tuneable charge detector of claim 13, wherein a longitudinal axis of the inductor is oriented vertically with respect to a major plane of extension of the substrate.

20. The tuneable charge detector of claim 13, wherein a longitudinal axis of the inductor is oriented horizontally with respect to a major plane of extension of the substrate.

21. The tuneable charge detector of claim 13, wherein the rings of conductive material are formed from at least one of the group consisting of nickel, molybdenum, indium tin oxide, tantalum, tungsten, gold, copper, doped polysilicon, silicide, or silver.

22. The tuneable charge detector of claim 13, wherein each of the rings is formed of a bottom conductive segment, an intermediate conductive segment, and a top conductive segment.

23. The tuneable charge detector of claim 22, wherein the intermediate conductive element includes two plugs in contact with each other.

24. The tuneable charge detector of claim 13, wherein the rings are generally circular.

25. The tuneable charge detector of claim 13, wherein the rings are generally rectangular.

26. An intertwined inductor pair, comprising, in the following order:

a first ring having a first conductive segment;

a second ring having a second conductive segment;

a third ring having a third conductive segment;

a fourth ring having a fourth conductive segment, the first, second, third, and fourth conductive segments being disposed on a same layer on a substrate, extending principally in a first direction, being parallel to each other, and being arranged spaced apart in a second direction substantially perpendicular to the first direction, each of the first, second, third, and fourth rings extending in a third direction substantially perpendicular to the second direction, each of the first, second, third, and fourth rings having a gap, wherein the first and the third rings are electrically connected by a first interconnection element to form a first inductor and the second and fourth rings are electrically connected by a second interconnection element to form a second inductor, the first and second inductors being electrically isolated from each other.

27. The intertwined inductor pair of claim 26, wherein the first and second interconnection elements extend in the second direction.

28. The intertwined inductor pair of claim 26, wherein the first and second interconnection elements extend at a non-zero angle with respect to the second direction.

29. An inductor formed in a substrate, comprising:
a plurality of conductive segments forming the inductor, the inductor having a longitudinal axis that substantially extends in parallel with a plane of major extension of a substrate upon which the inductor is formed,
the plurality of conductive segments including a first L shaped conductive segment having a major extension perpendicular to the longitudinal axis of the inductor and a minor extension in a direction parallel to the longitudinal axis of the inductor,
the plurality of conductive segments including a second L shaped conductive segment having a major extension perpendicular to the longitudinal axis of the inductor and a minor extension in a direction parallel to the longitudinal axis of the inductor,
wherein the first and second L shaped conductive segments lie within a same plane and the minor extensions of the first and second L shaped conductive segments are on opposing sides of the inductor.

30. The inductor of claim 29, wherein the minor extension of the second L shaped conductive segment extends toward the major extension of the first conductive segment and the minor extension of the first L shaped conductive segment extends toward the major extension of the second conductive segment.

31. The inductor of claim 29, wherein the minor extension of the second L shaped conductive segment extends away from the major extension of the first conductive segment and the minor extension of the first L shaped conductive segment extends toward the major extension of the second conductive segment.

32. The inductor of claim 29, wherein the first L shaped conductive segment is disposed adjacent to an I shaped rectangular conductive segment and the I shaped rectangular conductive segment is disposed adjacent to the second L shaped conductive segment.

33. The inductor of claim 29, wherein the inductor includes two plugs of conductive material in contact in a direction perpendicular to the plane of major extension of the substrate.

34. The inductor of claim 29, further comprising one or more dielectric layers over the first and second L shaped conductors and a rectangular conductive segment disposed over the one or more dielectric layers, the rectangular conductive segment electrically connecting the first and second L shaped conductors.

35. The inductor of claim 34, wherein the rectangular conductive segment is electrically connected to the first and second L shaped conductors through plugs of conductive material disposed within the one or more dielectric layers.

36. An inductor formed in a substrate, comprising:
a plurality of conductive segments forming the inductor, the inductor having a longitudinal axis that substantially extends in parallel with a plane of major extension of a substrate upon which the inductor is formed,
the plurality of conductive segments including a first L shaped conductive segment having a major extension perpendicular to the longitudinal axis of the inductor and a minor extension in a direction parallel to the longitudinal axis of the inductor,
the plurality of conductive segments including a second L shaped conductive segment having a major extension perpendicular to the longitudinal axis of the inductor and a minor extension in a direction parallel to the longitudinal axis of the inductor,
wherein the first and second L shaped conductive segments are disposed in different parallel planes,
wherein the minor extension of the second L shaped conductive segment extends toward the major extension of the first conductive segment and the minor extension of the first L shaped conductive segment extends toward the major extension of the second conductive segment.

37. The inductor of claim 36, wherein the minor extension of the second L shaped conductive segment extends away from the major extension of the first conductive segment and the minor extension of the first L shaped conductive segment extends toward the major extension of the second conductive segment.

38. The inductor of claim 36, wherein the minor extensions of the first and second L shaped conductive segments are on opposing sides of the inductor.

39. An inductor having a conductive core, comprising:
an inductor formed within a substrate, the inductor having a longitudinal axis extending substantially in parallel to the major plane of extension of the substrate, the inductor formed of conductive substantially rectangular segments and plugs of conductive material, the inductor having a bottom layer of substantially parallel conductive segments, a top layer of substantially parallel conductive segments, and two or more plugs of conductive material in physical contact with each other for electrically connecting each one of the substantially parallel conductive segments of the top layer to a corresponding one of the substantially parallel conductive segments of the bottom layer;
one or more dielectric layers formed between the bottom and top layers of substantially parallel conductive segments; and
a conductive core disposed along the longitudinal axis of the inductor and disposed within the one or more dielectric layers.

40. The inductor of claim 39, wherein the conductive core is formed of at least one of the group consisting of copper, gold, and a ferromagnetic material.

41. The inductor of claim 40, wherein the core of conductive material is encapsulated using a damascene process.

42. The inductor of claim 41, wherein the substantially parallel conductive segments of the top layer are not parallel to the substantially parallel conductive segments of the bottom layer.

43. The inductor of claim 42, wherein the one or more dielectric layers includes a nitride material.

* * * * *